United States Patent
Zhou et al.

(10) Patent No.: US 7,348,678 B2
(45) Date of Patent: Mar. 25, 2008

(54) INTEGRATED CIRCUIT PACKAGE TO PROVIDE HIGH-BANDWIDTH COMMUNICATION AMONG MULTIPLE DICE

(75) Inventors: Qing A. Zhou, Chandler, AZ (US); Wei O. Shi, Gilbert, AZ (US); Jiangqi He, Gilbert, AZ (US); Daoqiang Lu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 131 days.

(21) Appl. No.: 11/314,459

(22) Filed: Dec. 21, 2005

(65) Prior Publication Data

US 2007/0138647 A1    Jun. 21, 2007

(51) Int. Cl.
*H01L 23/48* (2006.01)
*H01L 21/00* (2006.01)
*B23K 31/02* (2006.01)

(52) U.S. Cl. ............... 257/776; 257/777; 257/778; 438/108; 228/180.22

(58) Field of Classification Search ............... None
See application file for complete search history.

(56) References Cited

U.S. PATENT DOCUMENTS

| 5,198,963 | A  | * | 3/1993 | Gupta et al. ............... 361/715 |
| 6,100,593 | A  | * | 8/2000 | Yu et al. ..................... 257/777 |
| 6,239,484 | B1 | * | 5/2001 | Dore et al. ................. 257/687 |
| 7,266,788 | B2 | * | 9/2007 | Haridass et al. ............. 716/1 |
| 2004/0120128 | A1 | * | 6/2004 | Chang ........................ 361/764 |

FOREIGN PATENT DOCUMENTS

WO       WO8500468       *   1/1985

* cited by examiner

*Primary Examiner*—Alonzo Chambliss
(74) *Attorney, Agent, or Firm*—Buckley, Maschoff & Talwalkar LLC

(57) ABSTRACT

A system may include a microprocessor die, an integrated circuit package substrate, and a die disposed between the microprocessor die and the integrated circuit package substrate. In some embodiments, the integrated circuit package substrate defines a first cavity, and the die is disposed at least partially within the first cavity.

3 Claims, 7 Drawing Sheets

INTEGRATED CIRCUIT PACKAGE TO PROVIDE HIGH-BANDWIDTH COMMUNICATION AMONG MULTIPLE DICE

BACKGROUND

A conventional microprocessor die may operate in conjunction with one or more other integrated circuit dice, including but not limited to a chipset die or a Random Access Memory (RAM) die. In one common architecture, a microprocessor package including a microprocessor die is coupled to a memory controller hub (MCH) package including a chipset die that is in turn coupled to a bank of memory modules including one or more RAM dies. This architecture may be unsuitable for certain pin counts and/or signal speeds.

Recent systems have sought to address these and other limitations by including a microprocessor die and one or more other dice within a single package. FIG. 1 illustrates one such implementation, in which system 1 includes microprocessor die 2 and dynamic RAM (DRAM) 3 coupled to integrated circuit package substrate 4. System 1 may provide faster interface speed than the above-mentioned conventional systems. However, a size and a routing complexity of substrate 4 are greater than would be required to support die 2 alone.

DETAILED DESCRIPTION

Figure 2:
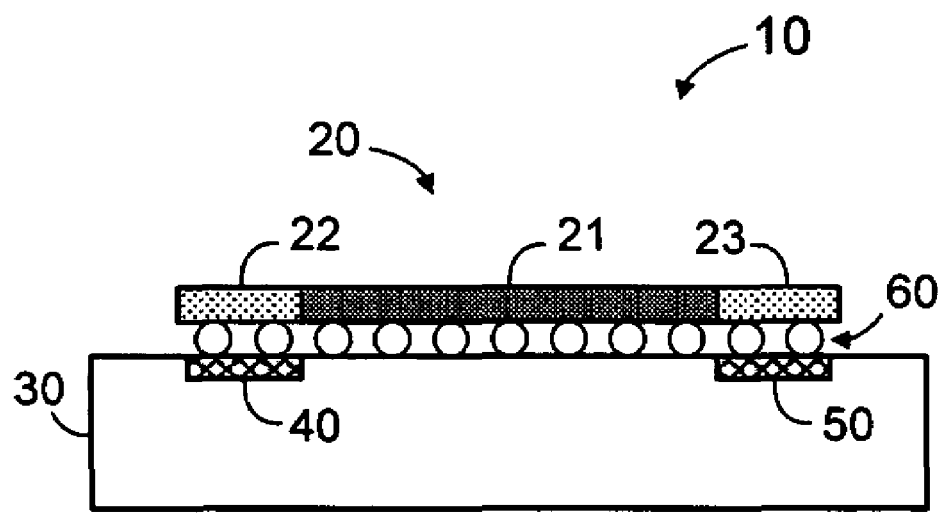
FIG. 2 is a side cross-sectional view of an apparatus according to some embodiments.

FIG. 2 is a cross-sectional side view of apparatus 10 according to some embodiments. Apparatus 10 includes microprocessor die 20 coupled to integrated circuit package substrate 30. Microprocessor die 20 includes integrated electrical devices for providing microprocessor functionality and may be fabricated using any suitable materials and fabrication techniques. The electrical devices may reside between a substrate of microprocessor die 20 and integrated circuit package substrate 30 in a "flip-chip" arrangement. In some embodiments, microprocessor die 20 comprises an Intel Pentium® microprocessor having a silicon substrate.

Integrated circuit package substrate 30 may comprise any ceramic, organic, and/or other suitable material, including but not limited to an organic laminated glass-weave polymer. Substrate 30 may include a base dielectric layer composed of any suitable material, including but not limited to bismaleimide triazine (BT) and FR4 in some embodiments. Fabricated on the base layer may be conductive layers separated by additional dielectric layers. The conductive layers comprise reference planes for supplying reference voltages to electrical components that are connected to substrate 30, or routing layers including conductive traces for carrying electrical signals between such electrical components.

Figure 1:
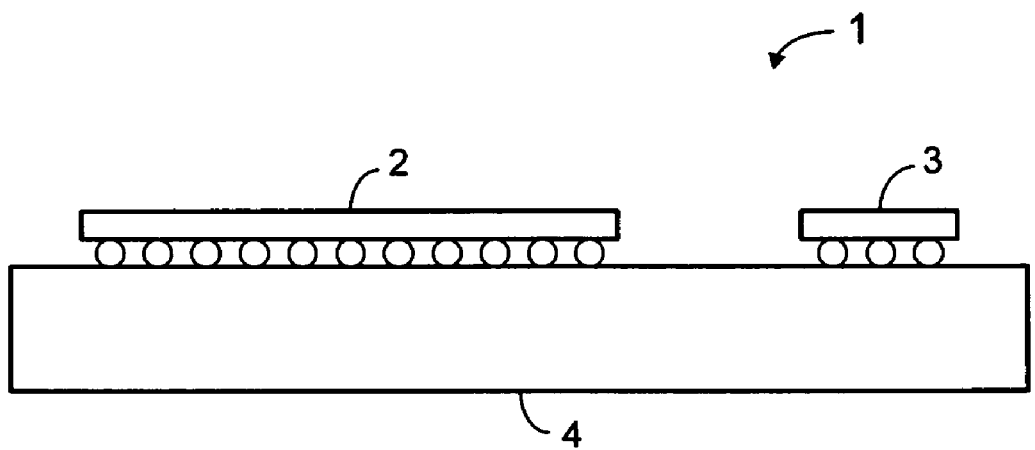
FIG. 1 is a side elevation of a prior art system.

Die 40 and die 50 are disposed between microprocessor die 20 and integrated circuit package substrate 30. Either of die 40 and die 50 may comprise a memory die, a chipset die, a microprocessor die, or any other suitable die fabricated using any system that is or becomes known. According to some embodiments, location of a die between a microprocessor die and an integrated circuit package substrate reduces routing and substrate size requirements with respect to the conventional system of FIG. 1.

According to some embodiments, die 40 and die 50 are DRAM "chips" having thicknesses ranging between 25 µm and 500 µm. Of course, some embodiments may employ any currently- or hereafter-known memory technology, including but not limited to Static RAM, Non-Volatile RAM, and Read Only Memory. In a case that die 40 and die 50 comprise memory dice, the electronic storage provided thereby may be used for any suitable purpose, examples of which include graphics memory, cache memory, and general-purpose memory.

According to the illustrated embodiment, substrate 30 defines a first cavity in which die 40 is at least partially disposed and a second cavity in which die 50 is at least partially disposed. Solder balls 60, which may comprise Controlled Collapse Chip Connect (C4) solder bumps, connect microprocessor die 20 to die 40, die 50 and substrate 30. More particularly, some of solder balls 60 connect electrical contacts of microprocessor die 20 to electrical contacts of substrate 30 and others of solder balls 60 connect electrical contacts of microprocessor die 20 to electrical contacts of dice 40 and 50. Solder balls 60 thereby connect the integrated electrical devices of microprocessor die 20 to integrated electrical devices of die 40 and die 50 as well as to conductive planes and/or traces of substrate 30.

As illustrated in FIG. 2, microprocessor die 20 comprises microprocessor block 21, integrated controller hub 22 and integrated controller hub 23. According to some embodiments in which dice 40 and 50 comprise memory dice, hubs 22 and 23 may comprise memory controller hubs. Die 40 is disposed between integrated controller hub 22 and substrate 30, and die 50 is disposed between integrated controller hub 23 and substrate 30. Such an arrangement may provide efficient routing of signals within apparatus 10.

Figure 3:
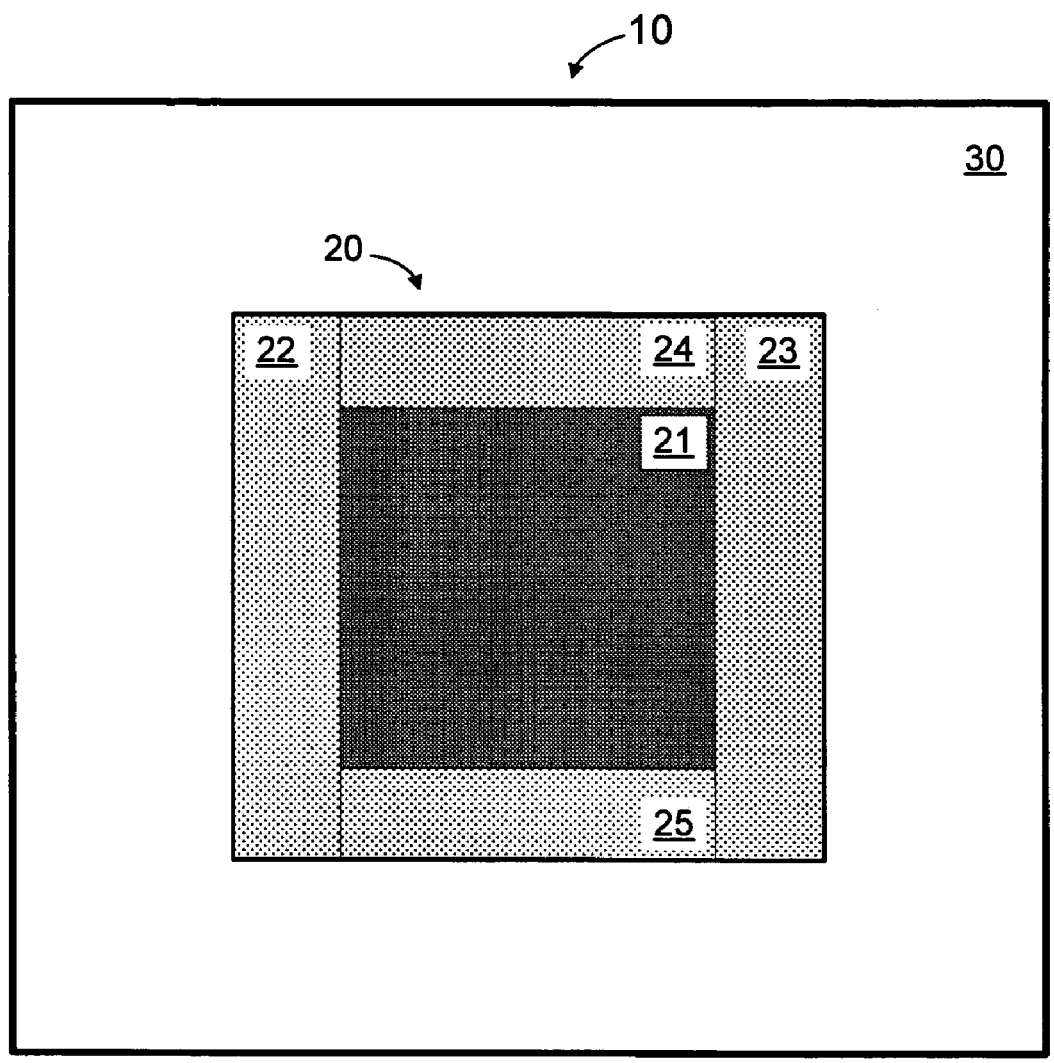
FIG. 3 is a top view of an apparatus according to some embodiments.

FIG. 3 is a top view of system 10 according to some embodiments. As illustrated, microprocessor die 20 comprises integrated controller hubs (or other blocks of interface circuitry) 22, 23, 24 and 25. Accordingly, substrate 30 may define four cavities, with each of the four cavities located beneath a respective one of integrated controller hubs 22, 23, 24 and 25. A die may be disposed in each of the four cavities. With reference to FIG. 2, integrated controller hub 25 and a corresponding die may be located in front of the plane of the drawing page, and integrated controller hub 24 and a corresponding die may be located behind the plane of the drawing page. Embodiments may include one or more die within a cavity of substrate 30, and zero or more corresponding integrated controller hubs of microprocessor 20.

Figure 4:
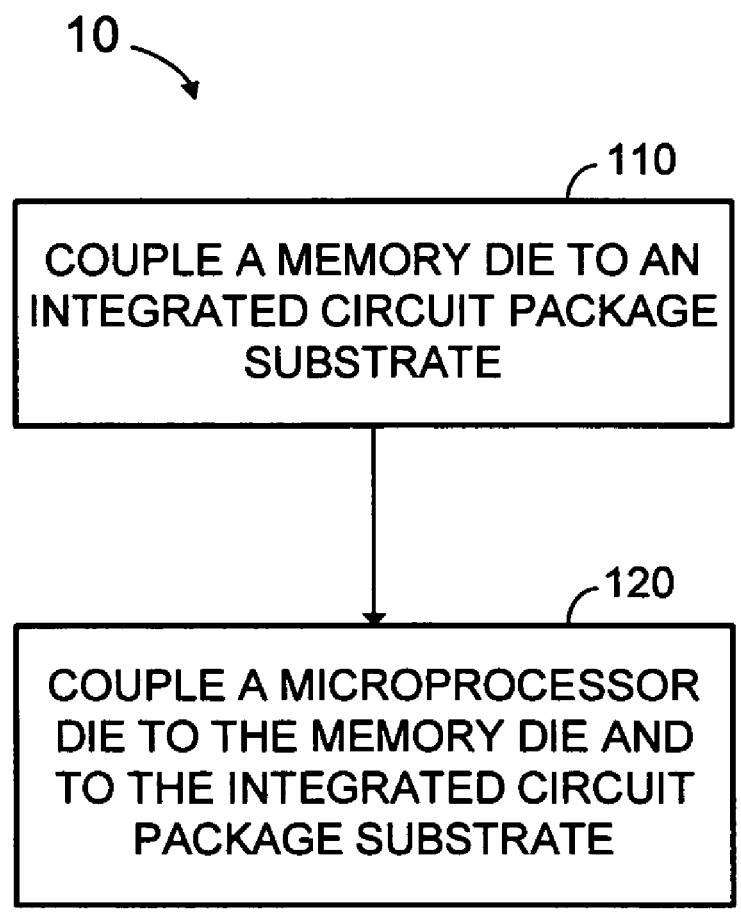
FIG. 4 is a diagram of a process to fabricate the FIG. 2 apparatus according to some embodiments.

FIG. 4 is a diagram of process 100 to fabricate an apparatus according to some embodiments. Process 100 may be executed by one or more devices, and all or a part of process 100 may be executed manually. Process 100 may be executed by an entity different from an entity that manufactures a microprocessor die and/or a peripheral die.

Initially, at 110, a die is coupled to an integrated circuit package substrate. According to some embodiments, the die is placed at least partially within a cavity defined by the integrated circuit substrate. An adhesive (e.g., epoxy) may be placed in the cavity to facilitate coupling of the die to the substrate.

Figure 5:
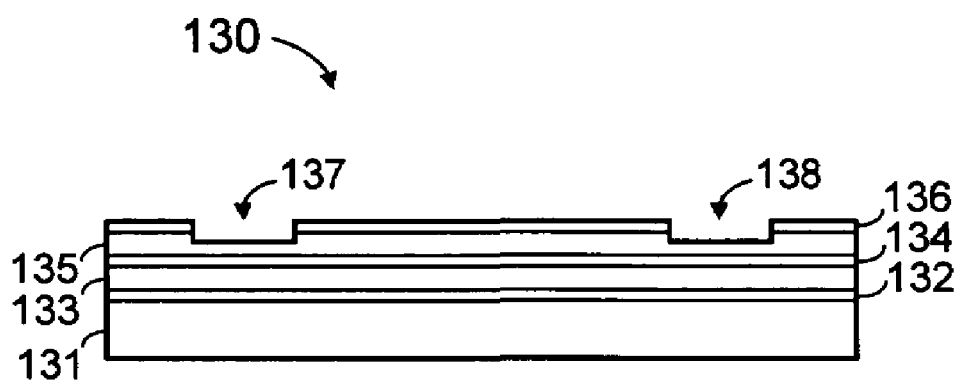
FIG. 5 is a side cross-sectional view of an integrated circuit package substrate according to some embodiments.

FIG. 5 shows a cross-sectional side view of integrated circuit package substrate 130 according to some embodiments of process 100. Substrate 130 includes base dielectric layer 131 and additional layers fabricated thereon. The additional layers include conductive layer 132, dielectric layer 133, conductive layer 134, dielectric layer 135, and conductive layer 136. As described above, the conductive layers may include conductive traces or planes to carry reference voltages and/or electrical signals. Substrate 130 also defines cavities 137 and 138, which extend into conductive layer 136 and dielectric layer 135.

Substrate 130 may be fabricated according to any current or future system. For example, cavities 137 and 138 maybe etched into substrate 130 after fabrication of layers 135 and 136 or may be defined during fabrication of layers 135 and 136. In addition, embodiments are not limited to the particular construction shown in FIG. 5.

Figure 6:
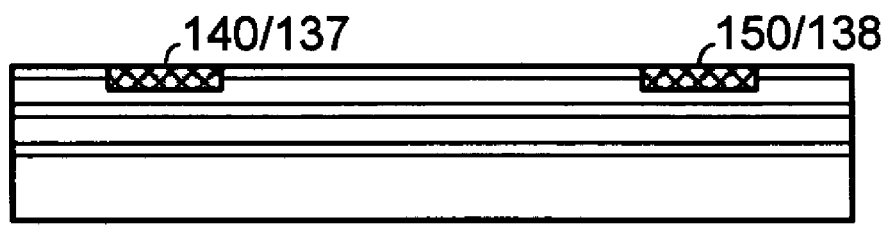
FIG. 6 is a side cross-sectional view of an integrated circuit package substrate and die according to some embodiments.

FIG. 6 is a cross-sectional side view of substrate 130 after coupling of a die at 110. In particular, die 140 is disposed in cavity 137 and die 150 is disposed in cavity 138. Any system, including but not limited to a pick-and-place system, may be used to place the die at 110.

Next, at 120, a microprocessor die is coupled to the die and to the integrated circuit package substrate. A pick-and-place system may also be used at 120 to align C4 solder balls of the microprocessor die with and place the balls on appropriate electrical contacts of the die and the integrated circuit package substrate. An example of the resulting apparatus is illustrated in FIG. 2. The resulting apparatus may be subjected to heat after 120 in order to reflow the solder balls and to thereby establish a solid physical and interconnection between the microprocessor die, the peripheral die and the integrated circuit package substrate.

Figure 7:
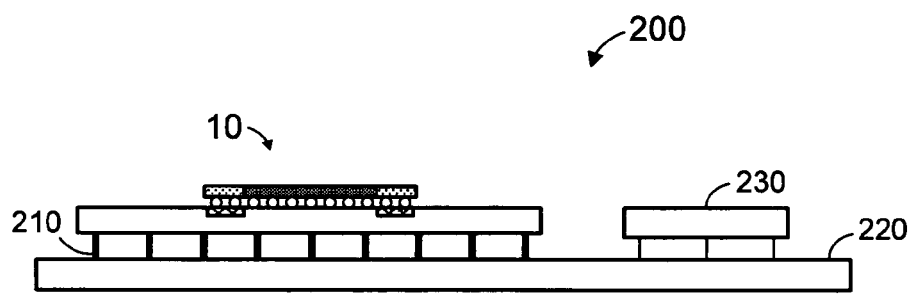
FIG. 7 is a side cross-sectional view of a system according to some embodiments.

FIG. 7 is a cross-sectional side view of system 200 according to some embodiments. System 200 may comprise components of a server platform. System 200 includes apparatus 10 as described above, through-hole pins 210, motherboard 220 and peripheral 230.

Through-hole pins 210 may carry power and I/O signals between elements of apparatus 10 and external devices. For example, motherboard 220 may comprise a memory bus (not shown) that is electrically coupled to through-hole pins 210 and to peripheral 230. Motherboard 220 may thereby electrically couple peripheral 230 to integrated electrical devices of apparatus 10. Alternative interconnects such as solder balls may be used instead of through-hole pins 210 to mount apparatus 10 to a motherboard, a socket, or another substrate. Peripheral 230 may comprise any type of peripheral for use in conjunction with apparatus 10, including but not limited to a graphics controller, an I/O controller, a memory for storing data, and a chipset.

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, persons skilled in the art will recognize from this description that other embodiments may be practiced with various modifications and alterations.

What is claimed is:

1. An apparatus comprising:
a microprocessor die comprising a microprocessor block and an integrated controller hub;
an integrated circuit package substrate defining a first cavity;
a die disposed at least partially within the first cavity and between the integrated controller hub and the integrated circuit package substrate;
a first solder bump in contact with the microprocessor block and the integrated circuit package substrate; and
a second solder bump in contact with the die and the integrated controller hub a second integrated controller hub which is not parallel to the integrated controller hub, a second die disposed between the second integrated controller hub and the integrated circuit package substrate, and a third solder bump in contact with the second die and the second integrated controller hub, wherein the integrated circuit package substrate defines a second cavity, and wherein the second die is disposed at least partially within the second cavity.

2. A method comprising:
coupling a die to an integrated circuit package substrate within a first cavity defined by the integrated circuit package substrate;
coupling a first solder bump to the integrated circuit package substrate;
coupling a second solder bump to the die;
coupling a microprocessor block of a microprocessor die to the first solder bump; and
coupling an integrated controller hub of the microprocessor die to the second solder bump,
wherein the die is disposed between the integrated controller hub and the integrated circuit package substrate
coupling a second die at leat partially within a second cavity defined by the integrated circuit package substrate;
coupling a third solder bump to the second die, coupling a second integrated controller hub of the microprocessor die to the third solder bump, wherein the second integrated controller hub which is not parallel to the integrated controller hub.

3. A system comprising:
a microprocessor die comprising a microprocessor block and an integrated controller hub;
an integrated circuit package substrate defining a first cavity;
a die disposed at least partially within the first cavity and between the integrated controller hub and the integrated circuit package substrate;
a first solder bump in contact with the microprocessor block and the integrated circuit package substrate;
a second solder bump in contact with the die and the integrated controller hub a second integrated controller hub which is not parallel to the integrated controller hub, a second die disposed between the second integrated controller hub and the integrated circuit package substrate, and a third solder bump in contact with the second die and the second integrated controller hub, wherein the integrated circuit package substrate defines a second cavity, and wherein the second die is disposed at least partially within the second cavity;
a motherboard connected to the integrated circuit package substrate; and
a graphics controller connected to the motherboard.

* * * * *